US012772876B2

(12) United States Patent
Agarwal et al.

(10) Patent No.: US 12,772,876 B2
(45) Date of Patent: Oct. 20, 2026

(54) MULTI-DIE COMMUNICATIONS COUPLINGS USING A SINGLE BRIDGE DIE

(71) Applicant: ADVANCED MICRO DEVICES, INC., Santa Clara, CA (US)

(72) Inventors: Rahul Agarwal, Santa Clara, CA (US); Raja Swaminathan, Austin, TX (US); John Wuu, Fort Collins, CO (US); Mihir Pandya, Austin, TX (US); Samuel D. Naffziger, Fort Collins, CO (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 380 days.

(21) Appl. No.: 17/563,921

(22) Filed: Dec. 28, 2021

(65) Prior Publication Data

US 2023/0069294 A1 Mar. 2, 2023

Related U.S. Application Data

(60) Provisional application No. 63/236,773, filed on Aug. 25, 2021.

(51) Int. Cl.

| | |
|---|---|
| ***H10W 70/65*** | (2026.01) |
| ***H10P 72/00*** | (2026.01) |
| ***H10P 72/70*** | (2026.01) |
| ***H10W 20/20*** | (2026.01) |
| ***H10W 90/00*** | (2026.01) |
| ***H10W 90/20*** | (2026.01) |

(52) U.S. Cl.

CPC ........... *H10W 70/65* (2026.01); *H10W 20/20* (2026.01); *H10W 90/00* (2026.01)

(58) Field of Classification Search

CPC ... H01L 23/5381; H01L 23/481; H01L 25/18; H01L 25/50; H01L 2221/68318; H01L 2221/68345; H01L 2221/68354; H01L 2225/06527; H01L 2225/06586; H01L 21/6835; H01L 25/0652; H10W 70/65; H10W 20/20; H10W 90/00; H10W 90/288; H10W 72/01; H10W 90/291; H10P 72/74; H10P 72/7412; H10P 72/7424; H10P 72/7428

See application file for complete search history.

(56) References Cited

U.S. PATENT DOCUMENTS

| | | | | |
|---|---|---|---|---|
| 2011/0227212 | A1* | 9/2011 | Cheng | H01L 25/50 257/E23.001 |
| 2011/0285006 | A1* | 11/2011 | Weng | H01L 23/49816 438/109 |
| 2013/0168854 | A1* | 7/2013 | Karikalan | H01L 24/73 257/784 |
| 2018/0366436 | A1* | 12/2018 | Wang | H01L 25/0652 |
| 2018/0374788 | A1* | 12/2018 | Nakagawa | H01L 25/18 |
| 2019/0206798 | A1* | 7/2019 | Collins | H01L 21/50 |
| 2019/0355642 | A1* | 11/2019 | Brown | H01L 23/3142 |
| 2020/0006251 | A1* | 1/2020 | Chen | H01L 21/56 |
| 2020/0176384 | A1* | 6/2020 | Wu | H01L 21/6835 |
| 2020/0211965 | A1* | 7/2020 | Wu | H01L 25/065 |

(Continued)

*Primary Examiner* — Herve-Louis Y Assouman

(57) ABSTRACT

A chip for multi-die communications couplings using a single bridge die, includes: a plurality of dies each including one or more functional circuit blocks; and a first bridge die directly communicatively coupling two or more pairs of dies of the plurality of dies.

20 Claims, 16 Drawing Sheets

(56) References Cited

U.S. PATENT DOCUMENTS

| | | | | |
|---|---|---|---|---|
| 2020/0219816 | A1* | 7/2020 | Aleksov | H01L 23/5386 |
| 2020/0227377 | A1* | 7/2020 | Liff | H01L 23/5386 |
| 2020/0258847 | A1* | 8/2020 | Pietambaram | H01L 24/19 |
| 2020/0411441 | A1* | 12/2020 | Darmawikarta | H01L 23/5381 |
| 2021/0020529 | A1* | 1/2021 | McHerron | H01L 23/13 |
| 2021/0028080 | A1* | 1/2021 | Pietambaram | H01L 25/0652 |
| 2021/0193616 | A1* | 6/2021 | Cheah | H01L 23/13 |

* cited by examiner

MULTI-DIE COMMUNICATIONS COUPLINGS USING A SINGLE BRIDGE DIE

BACKGROUND

Some semiconductor chip packages use multiple semiconductor dies that communicate with each other in order for the chip to perform particular functions. For example, a chip will include multiple system-on-chip dies or chiplets that each perform particular functions through the use of particular functional circuitry. Such chiplets or system-on-chip dies communicate with one another to carry out various functions.

DETAILED DESCRIPTION

Figure 1A:
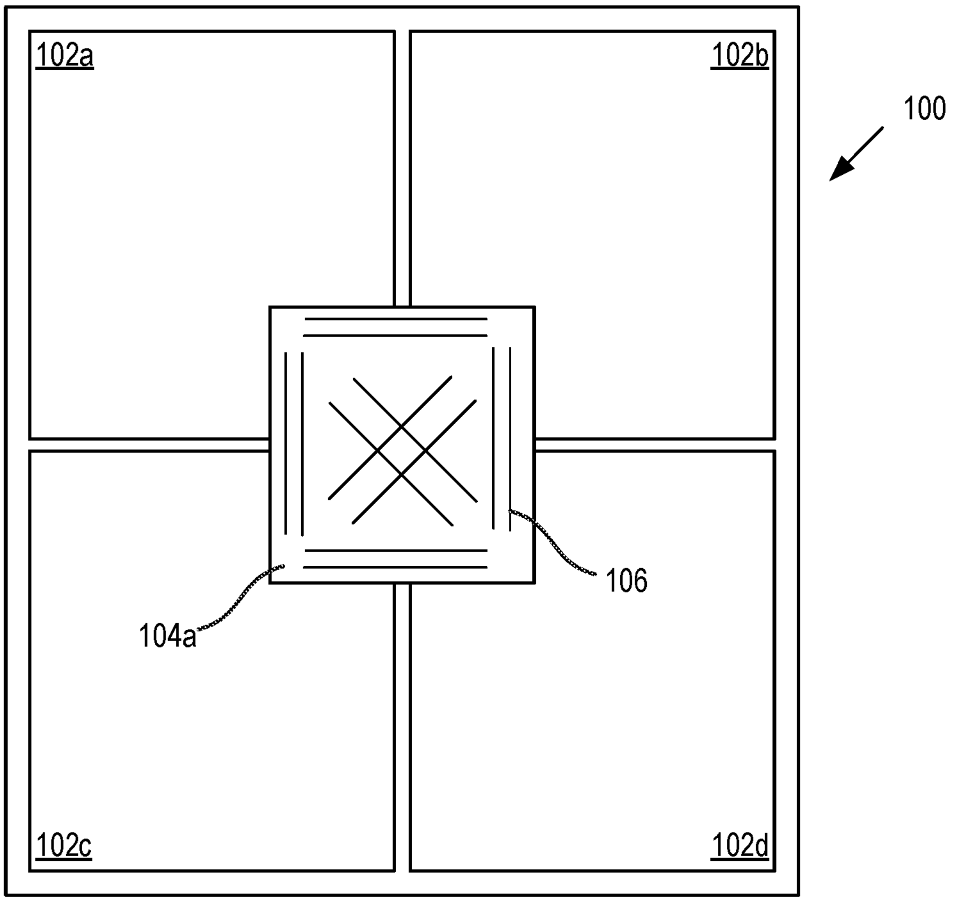
FIG. 1A is a block diagram of an example chip for multi-die communications couplings using a single bridge die according to some implementations.

As mentioned above, some semiconductor chip packages use multiple semiconductor dies that must communicate with each other for the chip to perform particular functions. For example, a chip will include multiple system-on-chip dies or chiplets that each perform particular functions through the use of particular functional circuitry. One approach to die-to-die communication is to couple a pair of dies using an interconnecting die (e.g., a bridge die). A bridge die is a die (e.g., a silicon die) that includes communications pathways that allow two dies bonded to the bridge die to communicate. However, existing solutions for bridge dies only allow for a single pair of dies to be communicatively coupled by a single bridge die. Where a die needs to communicate with more than one other die that is not positioned adjacent to the given die, such bridge dies are insufficient.

Another approach for die-to-die communication is to use communications pathways (e.g., conductive traces and the like) in a substrate to which the dies are coupled, such as a circuit board. In order to allow for the routing space required for these communications pathways on the substrate, the dies must be spaced some distance apart, increasing the overall footprint on the substrate used by the dies. Moreover, these direct connections increase power consumption and design overhead.

To that end, the present specification sets forth various implementations of multi-die communications couplings using a single bridge die. In some implementations, a chip for multi-die communications couplings using a single bridge die includes: a plurality of dies each including one or more functional circuit blocks; and a first bridge die directly communicatively coupling two or more pairs of dies of the plurality of dies.

In some implementations, the chip further includes one or more second bridge dies each directly communicatively coupling a respective pair of dies. In some implementations, the first bridge die directly communicatively couples each die of the plurality of dies to each other die. In some implementations, a plurality of communication paths in the first bridge die are non-overlapping. In some implementations, two or more communication paths in the first bridge die are overlapping. In some implementations, the chip further includes one or more other dies each bonded to a respective die of the plurality of dies. In some implementations, the plurality of dies includes one or more through-silicon vias (TSVs) to the one or more other dies. In some implementations, the plurality of dies includes a plurality of system-on-chip dies.

The present specification also describes various implementations of a method for multi-die communications couplings using a single bridge die. Such a method includes directly communicatively coupling, via a first bridge die, two or more pairs of dies in a plurality of dies, wherein each of the plurality of dies includes one or more functional circuit blocks; at least partially encapsulating the plurality of dies and the first bridge die to create an encapsulated component group; and bonding the encapsulated component group to a carrier wafer.

In some implementations, the method further includes bonding one or more other dies to a respective die of the plurality of dies, wherein the one or more other dies are included in the encapsulated component group. In some implementations, the plurality of dies includes a plurality of system-on-chip dies. In some implementations, the method further includes directly communicatively coupling a pair of dies using a second bridge die. In some implementations, the first bridge die directly communicatively couples each die of the plurality of dies to each other die.

Also described in this specification are various implementations of an apparatus for multi-die communications couplings using a single bridge die. Such an apparatus includes computer memory; a system-on-chip operatively coupled to the computer memory, wherein the system-on-chip includes: a plurality of dies each including one or more functional circuit blocks; and a first bridge die directly communicatively coupling two or more pairs of dies in the plurality of dies.

In some implementations, the chip further includes one or more second bridge dies each directly communicatively coupling one or more other pairs of dies. In some implementations, the first bridge die directly communicatively couples each die of the plurality of dies to each other die. In some implementations, a plurality of communication paths in the first bridge die are non-overlapping. In some implementations, two or more communication paths in the first bridge die are overlapping. In some implementations, the chip further includes one or more other dies each bonded to a respective die of the plurality of dies. In some implementations, the plurality of dies includes one or more through-silicon vias (TSVs) to the one or more other dies.

The following disclosure provides many different implementations, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes implementations in which the first and second features are formed in direct contact, and include implementations in which additional features are formed between the first and second features, such that the first and second features not in direct contact. Further, spatially relative terms, such as “beneath,” “below,” “lower,” “above,” “upper,” “back,” “front,” “top,” “bottom,” and the like, are used herein for ease of description to describe one element or feature’s relationship to another element(s) or feature(s) as illustrated in the figures. Similarly, terms such as “front surface” and “back surface” or “top surface” and “back surface” are used herein to identify various components more easily, and identify that those components are, for example, on opposing sides of another component. The spatially relative terms are intended to encompass different orientations of the device in use or operation in addition to the orientation depicted in the figures.

FIG. 1A is a block diagram of a non-limiting example chip 100. The example chip 100 can be implemented in a variety of computing devices, including mobile devices, personal computers, peripheral hardware components, gaming devices, set-top boxes, and the like. The chip 100 includes dies 102*a*, 102*b*, 102*c*, and 102*d*. Each die 102*a-d* is a block of semiconducting material such as silicon onto which a given functional circuit block is fabricated. For example, in some implementations, each die 102*a-d* is a system-on-chip (SoC) die. As another example, in some implementations, each die 102*a-d* is a chiplet.

Also included in the chip 100 is a bridge die 104*a*. The bridge die 104*a* is another die of semiconducting material such as silicon that includes communications pathways 106 directly communicatively coupling respective pairs of the dies 102*a-d*. For example, the communications pathways 106 include traces of conductive material, vias, and the like. In some implementations, the communications pathways 106 terminate at input/output (I/O) connection points of the dies 102*a-d* being coupled. Such I/O connection points include, for example, conductive plates, pins, pads, and the like on a surface of each of the dies 102*a-d* contacting a surface of the bridge die 104*a*. The pairs of dies 102*a-d* are considered to be directly communicatively coupled in that each coupled die 102*a-d* has a direct signal path to the other coupled die 102*a-d* without the need for routing via another die 102*a-d*.

As shown, the bridge die 104*a* of FIG. 1A includes communications pathways 106 that couple adjacent pairs of dies 102*a-d*. In this example, die 102*a* is adjacent to die 102*b* and 102*c*, die 102*b* is adjacent to die 102*a* and 102*d*, and die 102*c* is adjacent to die 102*a* and die 102*d*. The bridge die 104*a* also includes communications pathways 106 between non-adjacent dies 102*a,d* and dies 102*c,b*. In other words, the bridge die 104*a* communicatively couples a given die 102*a-d* to two or more other dies 102*a-d*. Moreover, the bridge die 104*a* also communicatively couples non-adjacent pairs of dies 102*a-d* that would otherwise be unavailable for coupling using a bridge die according to existing solutions. Here, the bridge die 104*a* directly communicatively couples each die 102*a-d* to each other die 102*a-d*.

The bridge die 104*a* of FIG. 1A includes overlapping communications pathways 106. In other words, two or more of the communications pathways 106 overlap vertically within the bridge die 104*a*. Here, communications pathways 106 between the dies 102*a,d* overlap with the communications pathways 106 between the dies 102*b,c*. In some implementations, the overlapping communications pathways 106 are located in different layers or are otherwise separated to prevent direct intersection between the overlapping communications pathways 106 in the bridge die 104*a*.

Figure 1B:
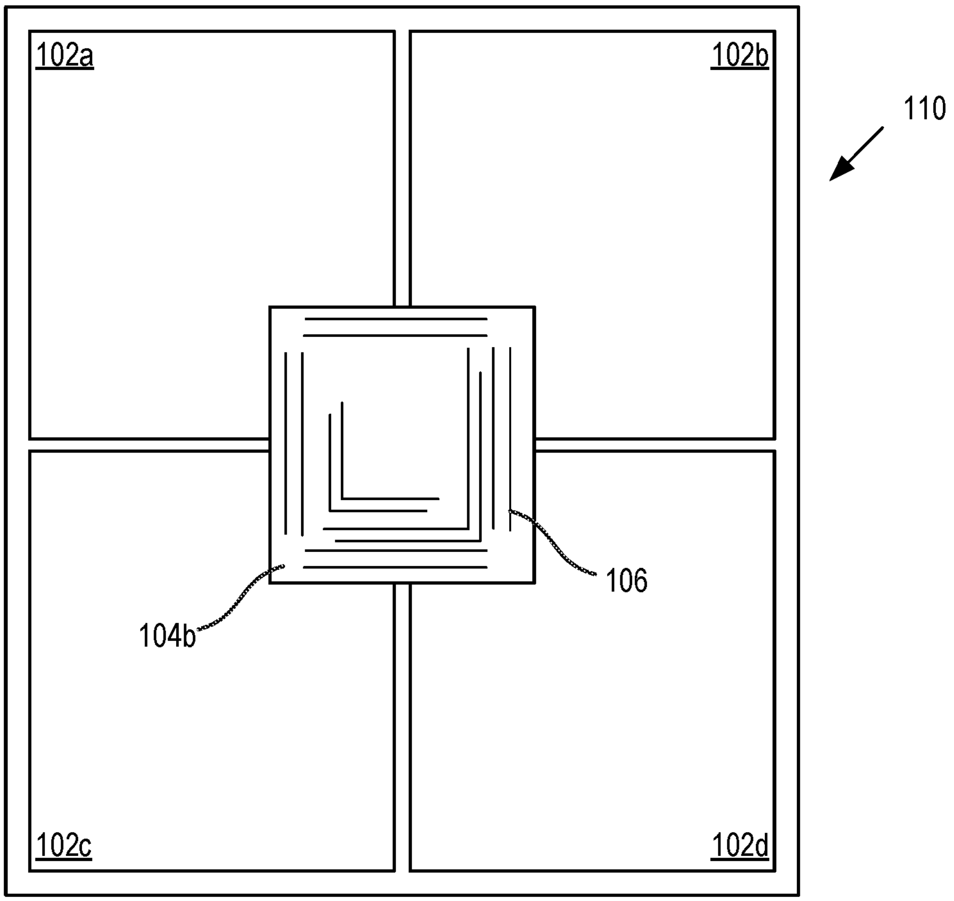
FIG. 1B is a block diagram of an example chip for multi-die communications couplings using a single bridge die according to some implementations.

FIG. 1B is a diagram of another non-limiting example chip 110. The example chip 110 of FIG. 1B is similar to the example chip 100 of FIG. 1A in that the example chip 110 includes dies 102*a-d* directly communicatively coupled by a bridge die 104*b*. The chip 110 differs from the chip 100 in that the communications pathways 106 of the bridge die 104*b* are non-overlapping. For example, where the bridge die 104*b* is restricted by a number of available layers or by other design considerations, the communications pathways

106 are arranged such that each die 102*a-d* is communicatively coupled to each other die 102*a-d* without the need for overlapping communications pathways 106.

Figure 1C:
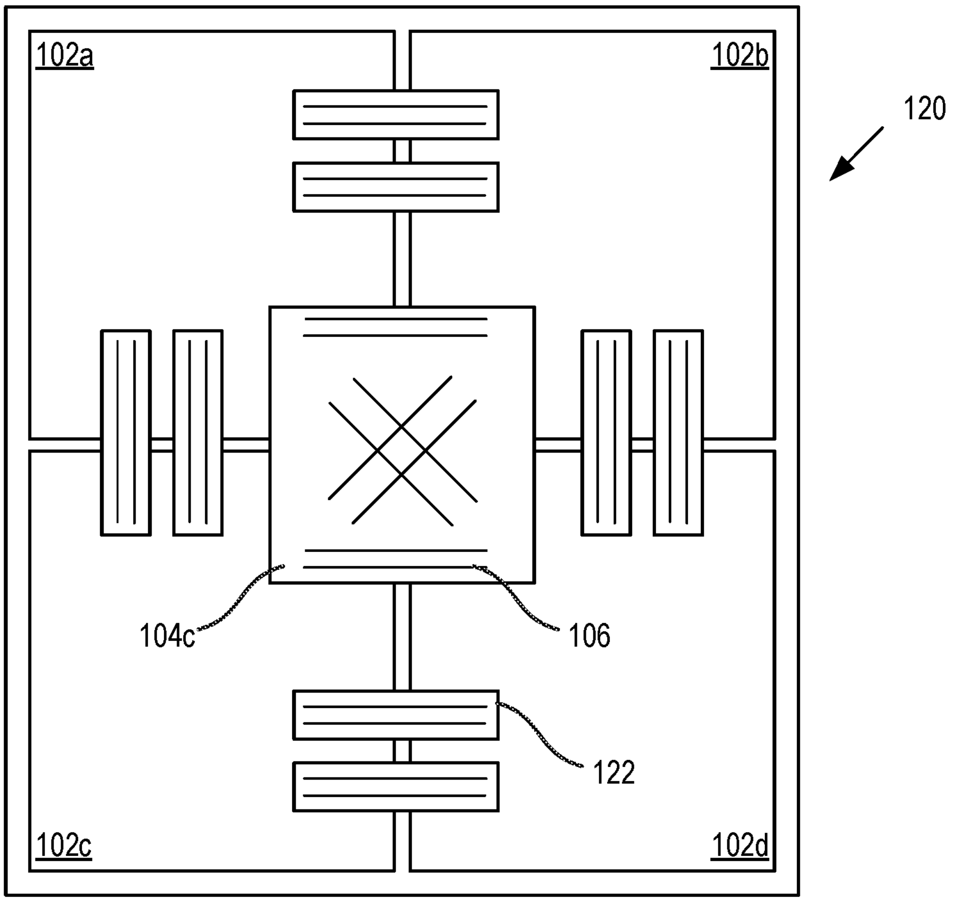
FIG. 1C is a block diagram of an example chip for multi-die communications couplings using a single bridge die according to some implementations.

FIG. 1C is a diagram of another non-limiting example chip 120. The example chip 120 of FIG. 1C is similar to the example chip 100 of FIG. 1A in that the example chip 120 includes dies 102*a-d* and a bridge die 104*a*. The chip 120 differs from the chip 100 in that, although the bridge die 104*c* couples a given die 102*a-d* to two or more other dies 102*a-d*, the bridge die 104*c* does not couple each die 102*a-d* to each other die 102*a-d*. For example, the bridge die 104*c* does not couple die 102*a* and die 102*c*, and does not couple die 102*b* and die 102*d*.

The chip 120 also includes bridge dies 122 that each couple adjacent pairs of dies 102*a-d*. Thus, dies 102*a* and 102*c*, as well dies 102*b* and 102*d*, are coupled using bridge dies 122. As shown in FIG. 1C, although dies 102*a* and 102*b*, as well as dies 102*c* and 102*d*, are coupled using the bridge die 104*c*, such pairs are also coupled using bridge dies 122. This provides additional communications pathways 106 between the coupled dies 102*a-d*, increasing bandwidth and parallel communication between the coupled dies 102*a-d*.

One skilled in the art will appreciate that the chips 100,110,120 of FIGS. 1A-C are merely exemplary and that other arrangements and configurations of dies 102*a-d*, bridge dies 104*a-c*, and bridge dies 122 are also contemplated within the scope of the present disclosure. As an example, in some implementations, additional dies 102*a-d* are included, or a differing arrangement of dies 102*a-d* is used, thereby necessitating different configurations of communications pathways 106 within bridge dies 104*a-c*. As another example, in some implementations, bridge dies 122 are added or removed to modify a number of communications pathways 106 and available parallelism.

Additionally, in some implementations, a bridge die 104*a-c* will communicatively couple multiple mutually exclusive pairs of dies 102*a-d*. For example, a bridge die 104*a-c* will couple pairs of non-adjacent dies 102*a-d* while other bridge dies 122 couple pairs of adjacent dies 102*a-d*. Furthermore, one skilled in the art will appreciate that the approaches set forth herein for multi-die communications couplings using a single bridge die allow for closer spacing between dies 102*a-d* when compared to the use of direct connections via a substrate, reducing the overall footprint of the chip and saving on routing space and power.

One skilled in the art will appreciate that the chips described herein are usable in a variety of computing devices or apparatus. Accordingly, in such apparatus, the chip is operatively coupled to other components such as computer memory, other chips or processors, or other components as can be appreciated.

FIGS. 2A-2I depict a process flow for assembling a chip for multi-die communications couplings using a single bridge die according to some implementations of the present disclosure. Beginning at FIG. 2A, multiple dies 202 are deposited (e.g., mounted or bonded) onto a carrier 204. The dies 202 include dies 102*a-d* as described above with respect to FIGS. 1A-C. Although FIGS. 2A-2I show a cross-sectional view depicting a single row of dies 202, it is understood that additional rows of dies 202 are deposited behind the shown row of dies 202 and therefore are hidden from view. The carrier 204 is a plate, wafer, or other body of material such as glass that provides mechanical and structural support for a chip during manufacture.

In some implementations, a surface of the dies 202 that contacts the carrier 204 includes one or more redistribution layers 205 (e.g., back-end-of-line (BEOL) layers). The redistribution layers 205 are successive layers of dielectric material such as polyimide or another insulating material. The redistribution layers 205 house conductive traces and other conductive materials coupled to the I/O points of the dies 202 (e.g., conductive plates or pads), thereby providing access to the I/O points of the dies 202 and allowing for connectivity between the dies 202 and other components of an apparatus including the chip (e.g., via a circuit board or other substrate).

Figure 2A:
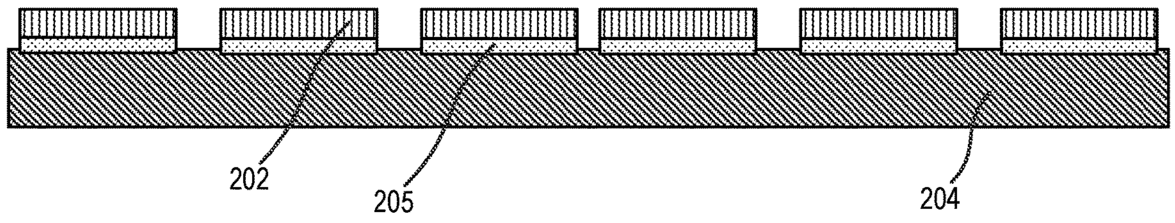
FIG. 2A is a portion of a flow diagram for manufacturing a chip for multi-die communications couplings using a single bridge die according to some implementations.
Figure 2B:
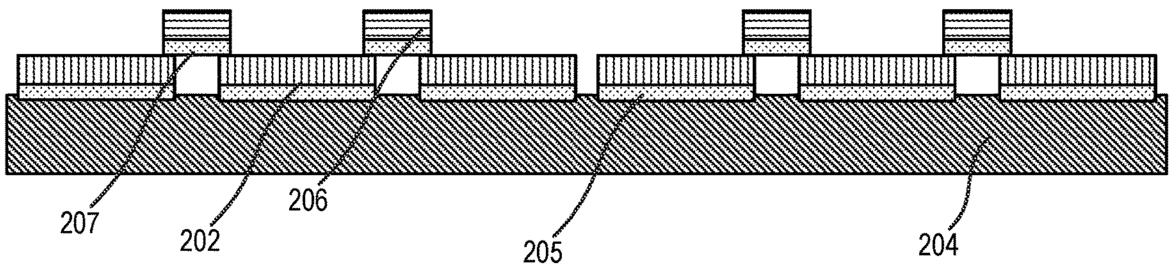
FIG. 2B is a portion of a flow diagram for manufacturing a chip for multi-die communications couplings using a single bridge die according to some implementations.

At FIG. 2B, bridge dies 206 are communicatively coupled to two or more dies 202, thereby providing direct communications paths between the two or more dies 202. As an example, the dies 202 include through-silicon vias (TSVs) (not shown) that electrically contact the bridge dies 206. As shown, in some implementations, a given bridge die 206 will provide a communications path between a die 202 in a given row and one or more other dies 202 in another row hidden from view. In some implementations, a surface of a bridge die 206 contacting a die 202 includes one or more redistribution layers 207. Thus, a communications path between two dies 202 coupled by the bridge die 206 traverses conductive materials in the redistribution layers 207.

Figure 2C:
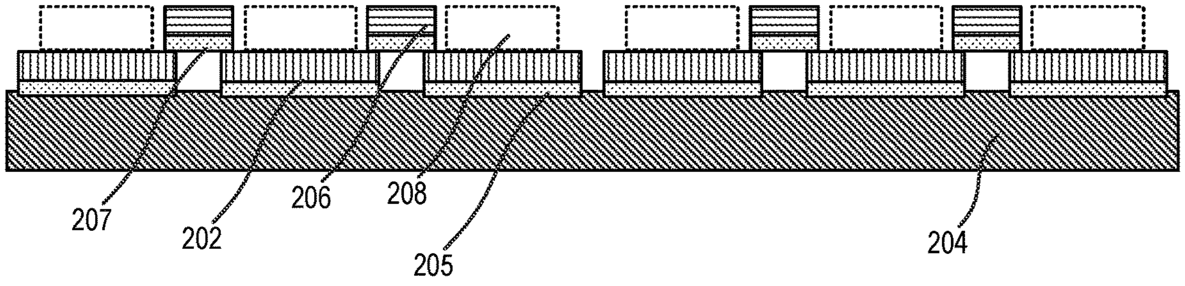
FIG. 2C is a portion of a flow diagram for manufacturing a chip for multi-die communications couplings using a single bridge die according to some implementations.

At FIG. 2C, one or more other dies 208 are optionally bonded to one or more of the dies 202. In some embodiments, the dies 208 are similar in functionality to the dies 202. In some implementations, a surface of a die 208 contacting a die 202 includes one or more redistribution layers (not shown) similar to redistribution layers 205. In implementations where the dies 208 are bonded to the dies 202, the dies 202 include one or more through silicon vias (TSVs) (not shown). The TSVs provide a conductive pathway from one surface of a die 202 to another surface of the die 202. Thus, the TSVs provide a conductive pathway from a die 208 to the redistribution layers 205 of a die 202, thereby providing operative access to the die 208 via the redistribution layers 205.

In some implementations, additional dies 208 are optionally bonded to an underlying die 208, thereby creating an additional layer of dies 208. Additionally, in implementations where only some of the dies 202 have dies 208 added, a silicon dummy wafer is added to those dies 202 without dies 208 to ensure a substantially coplanar height across the chip.

Figure 2D:
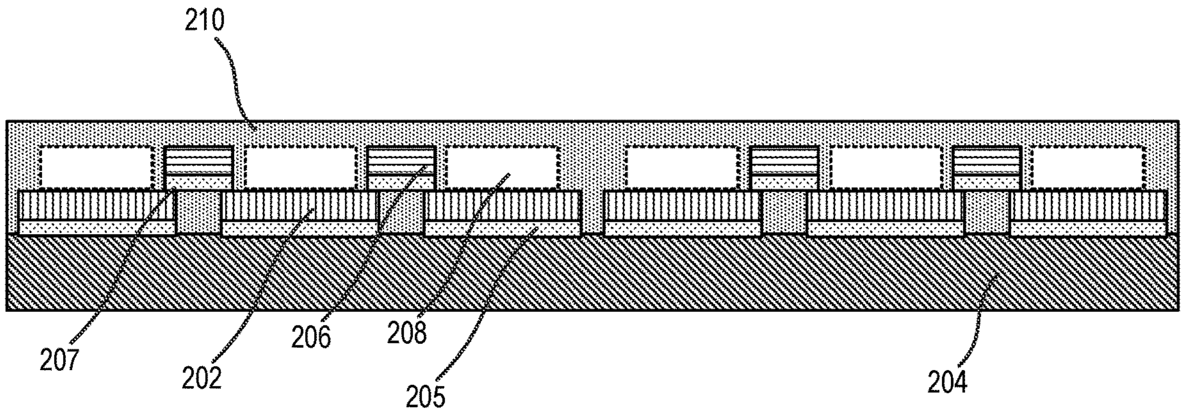
FIG. 2D is a portion of a flow diagram for manufacturing a chip for multi-die communications couplings using a single bridge die according to some implementations.

At FIG. 2D, the dies 202, bridge dies 206, and dies 208 (where present) are at least partially encapsulated using an encapsulant 210 such as oxide, mold or another molding material as can be appreciated, thereby forming an encapsulated component group of the dies 202, bridge dies 206, and optional dies 208. The encapsulant 210 serves to fill air gaps between components and, when hardened, fixes the dies 202, bridge dies 206, and dies 208 in place.

Figure 2E:
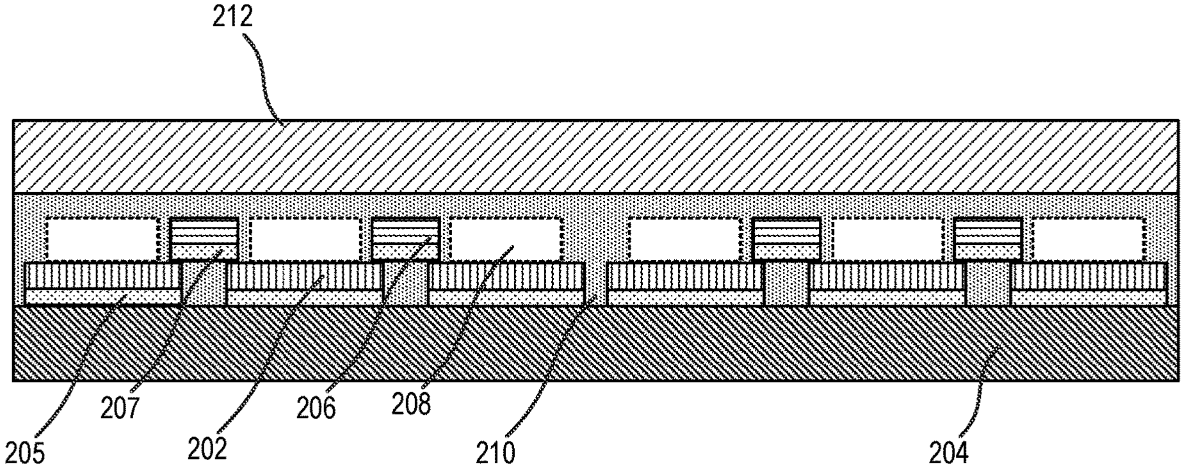
FIG. 2E is a portion of a flow diagram for manufacturing a chip for multi-die communications couplings using a single bridge die according to some implementations.
Figure 2F:
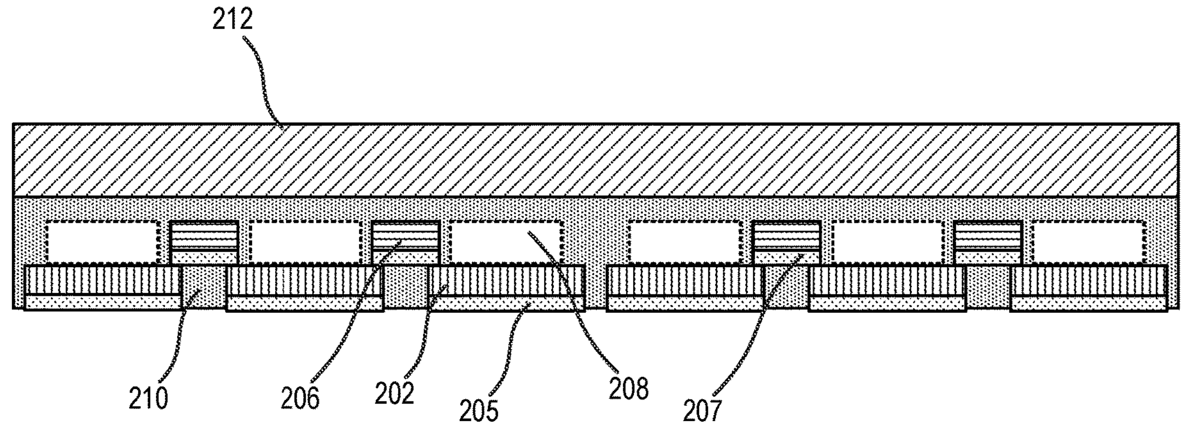
FIG. 2F is a portion of a flow diagram for manufacturing a chip for multi-die communications couplings using a single bridge die according to some implementations.

At FIG. 2E, a carrier wafer 212 is bonded to the encapsulant layer including the encapsulated components. The carrier wafer 212 is a wafer of material such as silicon that provides structural and mechanical support for the components after removal of the carrier 204, shown in FIG. 2F, thereby exposing the redistribution layers 205 of the dies 202.

Figure 2G:
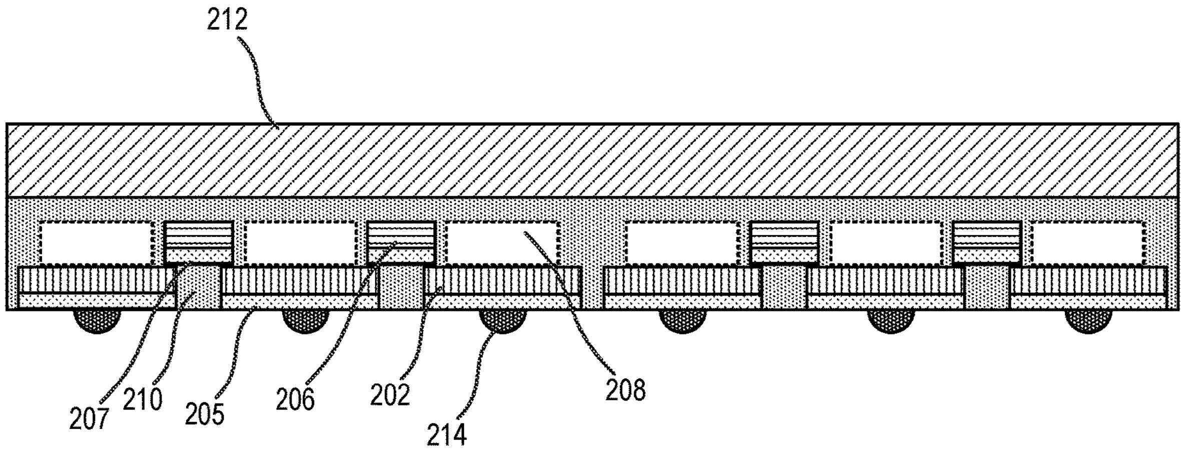
FIG. 2G is a portion of a flow diagram for manufacturing a chip for multi-die communications couplings using a single bridge die according to some implementations.
Figure 2H:
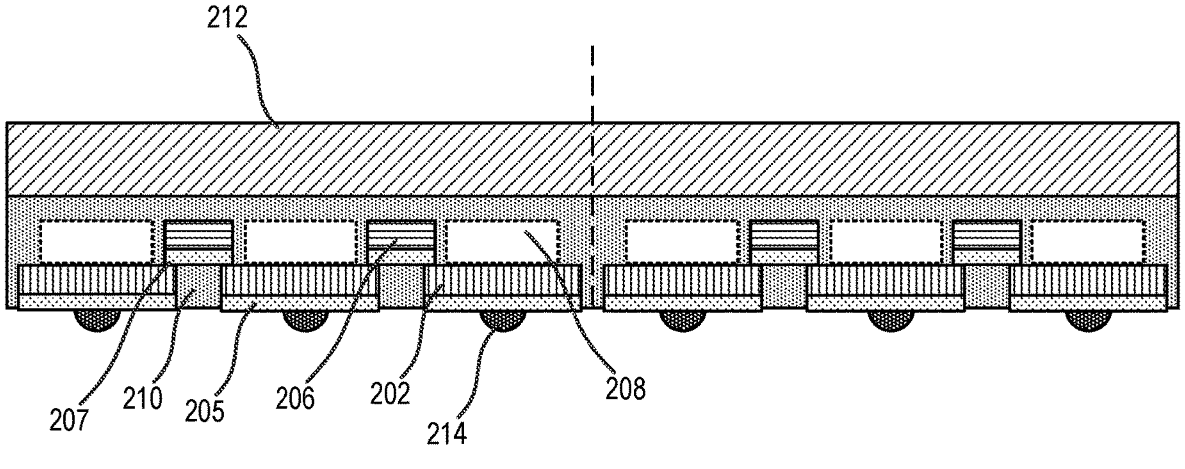
FIG. 2H is a portion of a flow diagram for manufacturing a chip for multi-die communications couplings using a single bridge die according to some implementations.
Figure 2I:
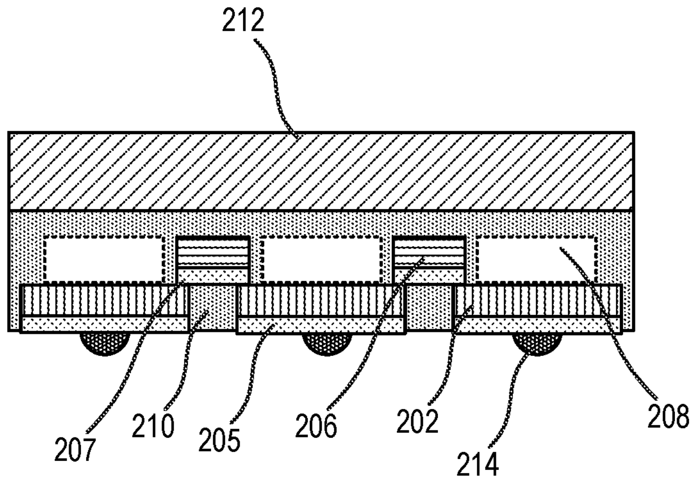
FIG. 2I is a portion of a flow diagram for manufacturing a chip for multi-die communications couplings using a single bridge die according to some implementations.

At FIG. 2G, depositions of solder 214 are applied to the redistribution layers 205 of the dies 202. The solder 214 is a conductive metal alloy including tin, lead, or other materials. By depositing the solder 214 on the redistribution layers 205, a conductive pathway is formed between the solder 214 at the surface of the chip, the dies 202, and the optional dies 208. As an example, the solder 214 facilitates mounting the chip on a substrate by aligning the solder with a socket or conductive points on the substrate and melting the solder 214 to form a conductive bond between the chip and the substrate. At FIG. 2H, the carrier wafer 212 and encapsulant 210 are sliced to create separate, individual chip packages as shown in FIG. 2I.

FIGS. 3A-3I depict a process flow for assembling a chip for multi-die communications couplings using a single bridge die according to some implementations of the present disclosure. FIGS. 3A-3I differ from FIGS. 2A-2I in that FIGS. 3A-3I depict multi-die communications couplings using a single bridge die for multi-stacked dies. Beginning at FIG. 3A, multiple dies 302 are deposited (e.g., mounted or bonded) onto a carrier 304. Is understood that additional rows of dies 302 are deposited behind the shown row of dies 302 and therefore are hidden from view. In some implementations, a surface of the dies 302 that contacts the carrier 304 includes one or more redistribution layers 305 (e.g., back-end-of-line (BEOL) layers) housing conductive traces and other conductive materials coupled to the I/O points of the dies 302 (e.g., conductive plates or pads), thereby providing access to the I/O points of the dies 302 and allowing for connectivity between the dies 302 and other components of an apparatus including the chip (e.g., via a circuit board or other substrate).

Figure 3A:
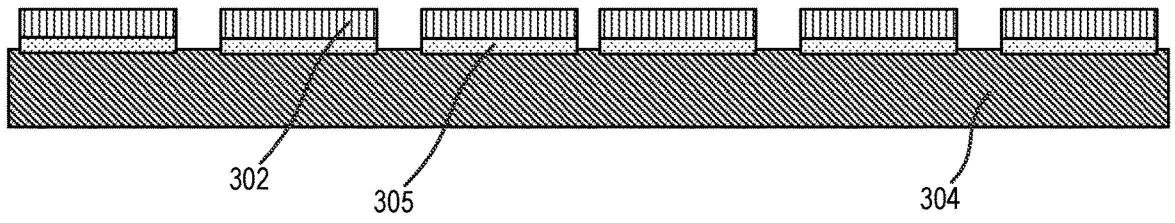
FIG. 3A is a portion of a flow diagram for manufacturing a chip for multi-die communications couplings using a single bridge die according to some implementations.
Figure 3B:
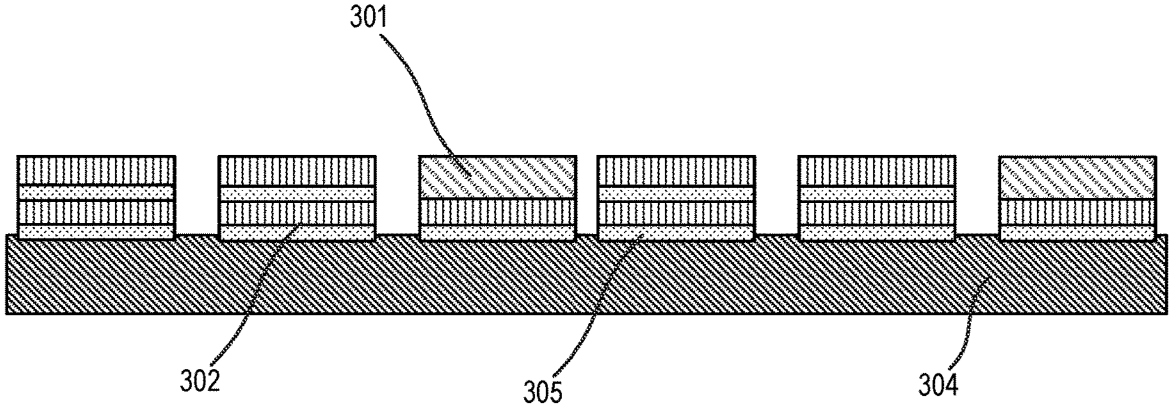
FIG. 3B is a portion of a flow diagram for manufacturing a chip for multi-die communications couplings using a single bridge die according to some implementations.
Figure 3C:
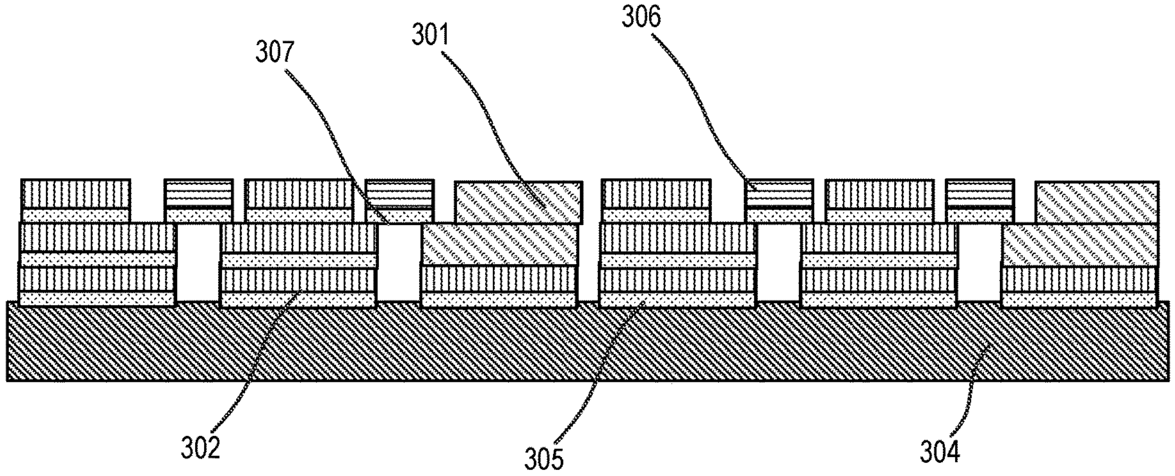
FIG. 3C is a portion of a flow diagram for manufacturing a chip for multi-die communications couplings using a single bridge die according to some implementations.

At FIG. 3B, an additional layer of dies 302 are deposited on the first layer of dies 302. Additionally, one or more dummy 301 dies are deposited onto one or more of the dies 302. A dummy 301 is a portion of silicon or another material lacking functional circuitry or other components that facilitates alignments and layering of dies 302 in the chip. At FIG. 3C, bridge dies 306 are communicatively coupled to two or more dies 302, thereby providing direct communications paths between the two or more dies 302. As an example, the dies 302 include through-silicon vias (TSVs) (not shown) that electrically contact the bridge dies 306. As shown, in some implementations, a given bridge die 306 will provide a communications path between a die 302 in a given row and one or more other dies 302 in another row hidden from view. In some implementations, a surface of a bridge die 306 contacting a die 302 includes one or more redistribution layers 307. Thus, a communications path between two dies 302 coupled by the bridge die 306 traverses conductive materials in the redistribution layers 307. As also shown in FIG. 3C, additional dummies 301 are deposited onto the initial layer of dummies 301, and dies 302 are deposited on the underlying later of dies 302. Thus, a topmost layer of dies 302, bridge dies 306, and dummies 301 is formed.

Figure 3D:
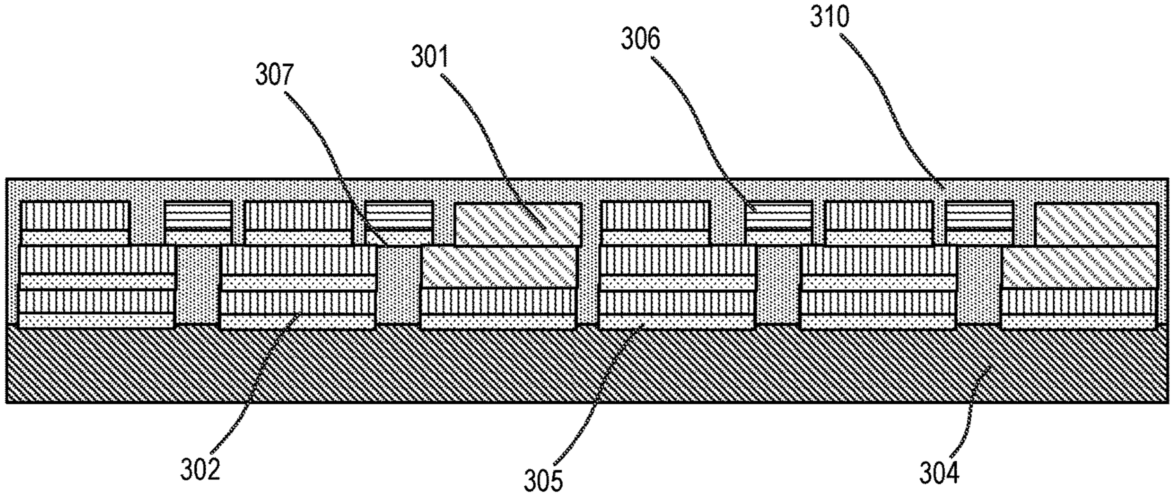
FIG. 3D is a portion of a flow diagram for manufacturing a chip for multi-die communications couplings using a single bridge die according to some implementations.
Figure 3E:
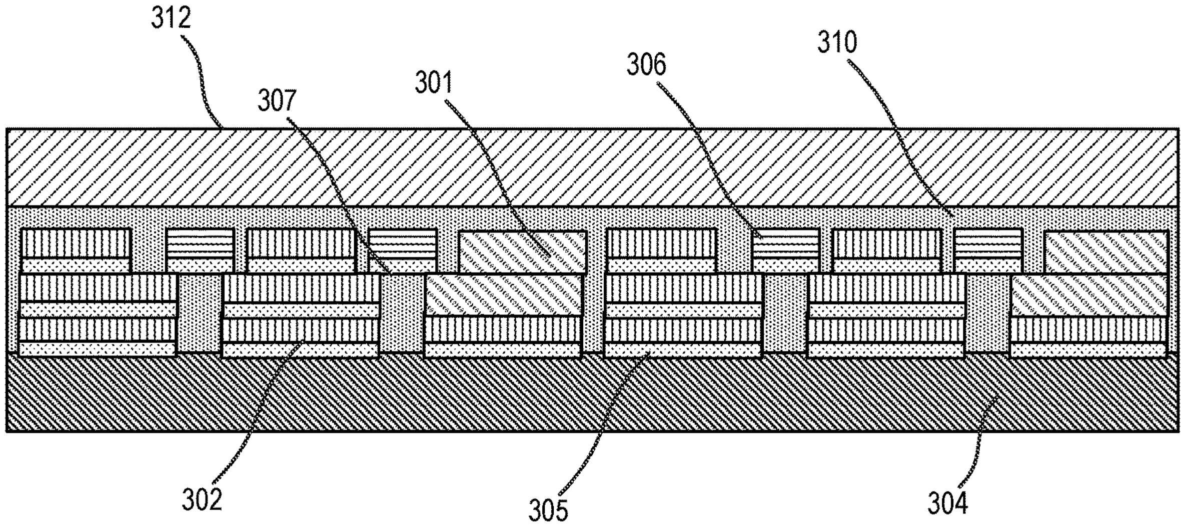
FIG. 3E is a portion of a flow diagram for manufacturing a chip for multi-die communications couplings using a single bridge die according to some implementations.
Figure 3F:
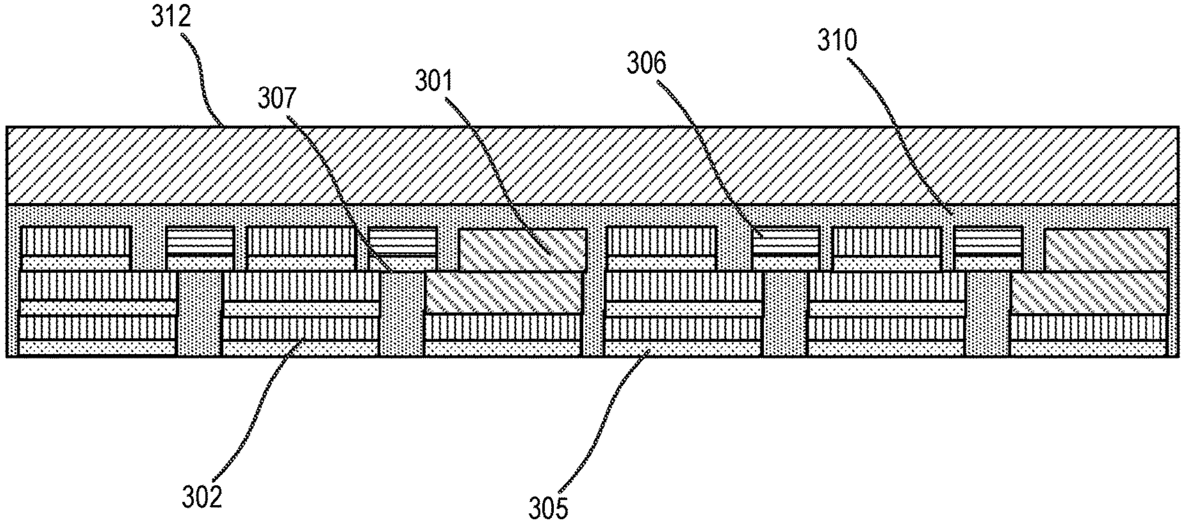
FIG. 3F is a portion of a flow diagram for manufacturing a chip for multi-die communications couplings using a single bridge die according to some implementations.

At FIG. 3D, the dies 302, bridge dies 306, and dummies 301 are at least partially encapsulated using an encapsulant 310 such as oxide, mold or another molding material as can be appreciated, thereby forming an encapsulated component group of the dies 302, bridge dies 306, and dummies 301. The encapsulant 310 serves to fill air gaps between components and, when hardened, fixes the dies 302, bridge dies 306, and dummies 301 in place. At FIG. 3E, a carrier wafer 312 is bonded to the encapsulant layer including the encapsulated components. The carrier wafer 312 is a wafer of material such as silicon that provides structural and mechanical support for the components after removal of the carrier 304, shown in FIG. 2F, thereby exposing the redistribution layers 305 of the dies 302.

Figure 3G:
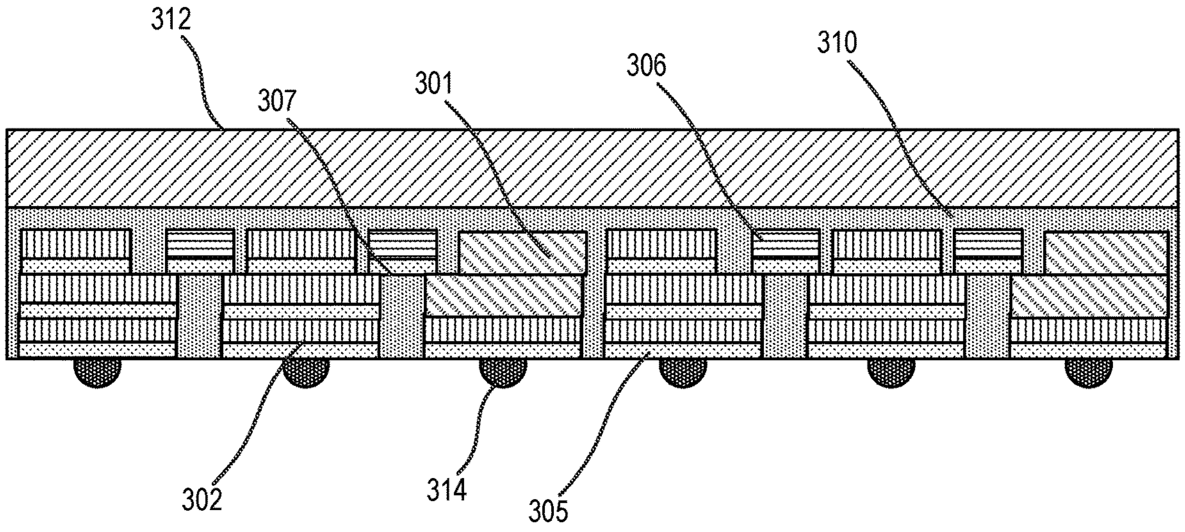
FIG. 3G is a portion of a flow diagram for manufacturing a chip for multi-die communications couplings using a single bridge die according to some implementations.
Figure 3H:
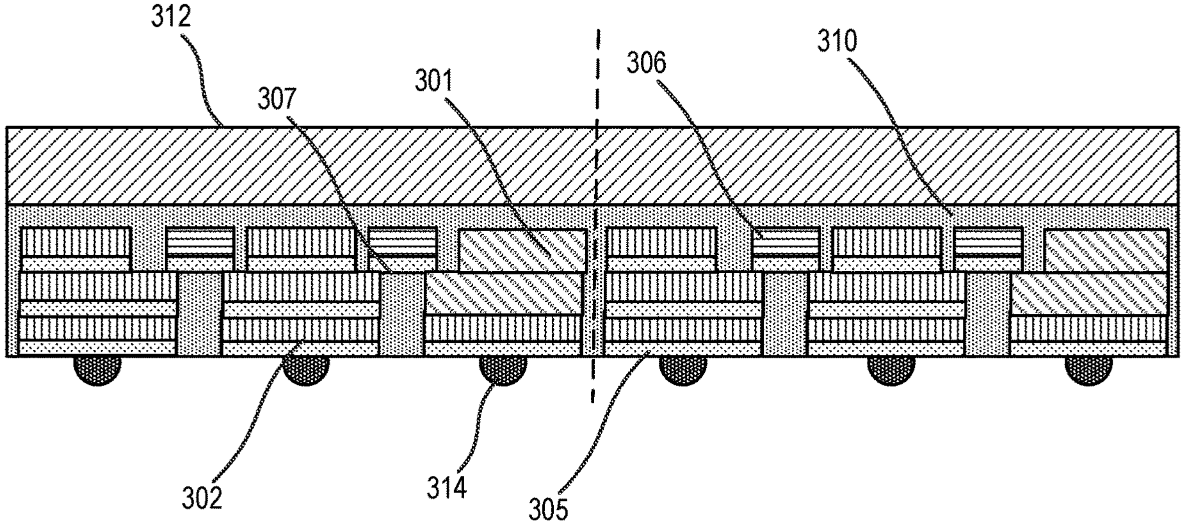
FIG. 3H is a portion of a flow diagram for manufacturing a chip for multi-die communications couplings using a single bridge die according to some implementations.
Figure 3I:
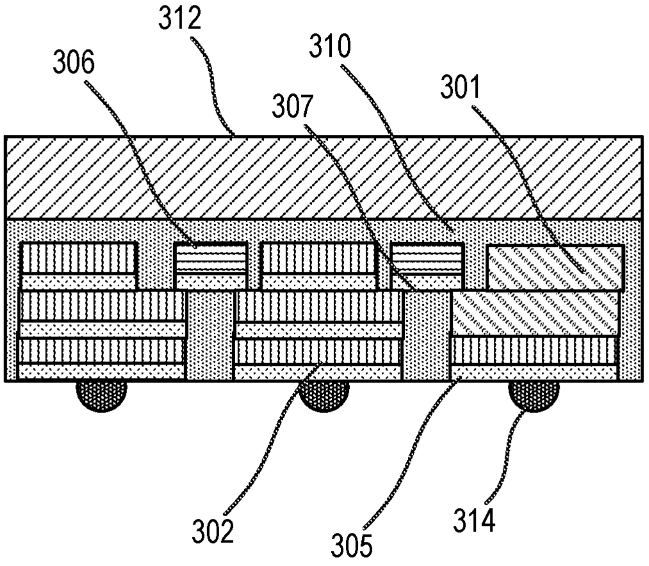
FIG. 3I is a portion of a flow diagram for manufacturing a chip for multi-die communications couplings using a single bridge die according to some implementations.

At FIG. 3G, depositions of solder 314 are applied to the redistribution layers 305 of the dies 302. At FIG. 3H, the carrier wafer 312 and encapsulant 310 are sliced to create separate, individual chip packages as shown in FIG. 3I.

Figure 4:
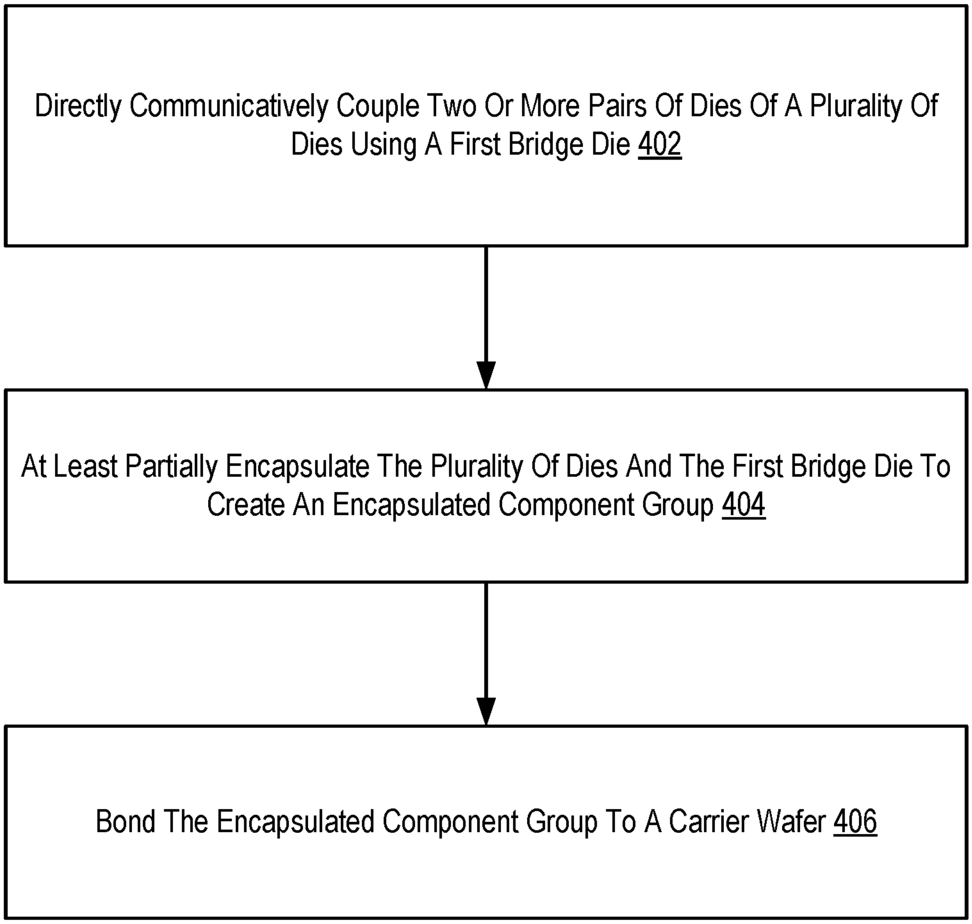
FIG. 4 is a flowchart of an example method of manufacture for multi-die communications couplings using a single bridge die according to some implementations.

For further explanation, FIG. 4 sets forth a flow chart illustrating an example method of manufacture of a chip for multi-die communications couplings using a single bridge die that includes directly communicatively coupling 402 two or more pairs of dies 202 of a plurality of dies 202 using a first bridge die 206. The dies 202 are blocks of semiconducting material such as silicon onto which a given functional circuit block is fabricated. For example, in some implementations, each die 202 is a system-on-chip (SoC) die. As another example, in some implementations, each die 202 is a chiplet.

The bridge die 202 is another die of semiconducting material such as silicon that includes communications pathways 106 directly communicatively coupling the pairs of the dies 202. For example, the communications pathways 106 include traces of conductive material, vias, and the like. In some implementations, the communications pathways 106 terminate at input/output (I/O) connection points of the dies 202 being coupled. Such I/O connection points include, for example, conductive plates, pins, pads, and the like on a surface of each of the dies 102*a-d* contacting a surface of the bridge die 206. The pairs of dies 202 are considered to be directly communicatively coupled in that each coupled die 202 has a direct signal path to the other coupled die 202 without the need for routing via another die 202.

In some implementations, the pairs of dies 202 coupled by the bridge die 206 are mutually exclusive. That is, each die 202 in a pair coupled by the bridge die 206 is not coupled to another die 202 using the bridge die 206. In some implementations, the pairs of dies 202 coupled by the bridge die 206 at least partially overlap. That is, a given die 202 coupled to at least two other dies 202 using the bridge die 206. One skilled in the art will appreciate that various combinations and pairings of coupled dies 202 are contemplated within the scope of the present disclosure.

In some implementations, the dies 202 are mounted on or bonded to a carrier 204. The carrier 204 is a plate, wafer, or other body of material such as glass that provides mechanical and structural support for a chip during manufacture. In some implementations, a surface of the dies 202 that contacts the carrier 204 includes one or more redistribution layers 205 (e.g., back-end-of-line (BEOL) layers). The redistribution layers 205 are successive layers of dielectric material such as polyimide or another insulating material. The redistribution layers 205 house conductive traces and other conductive materials coupled to the I/O points of the dies 202 (e.g., conductive plates or pads), thereby providing access to the I/O points of the dies 202 and allowing for connectivity between the dies 202 and other components of an apparatus including the chip (e.g., via a circuit board or other substrate). In some implementations, a surface of a bridge die 206 contacting a die 202 includes one or more redistribution layers 207. Thus, a communications path between two dies 202 coupled by the bridge die 206 traverses conductive materials in the redistribution layers 207.

The method of FIG. 4 also includes at least partially encapsulating 404 the plurality of dies 202 and the first bridge die 206 to create an encapsulated component group. The plurality of dies 202 and the first bridge die 206 are encapsulated using an encapsulant 210, thereby forming an encapsulated component group of the dies 202 and first bridge die 206. The encapsulant 210 serves to fill air gaps between components and, when hardened, fixes the dies 202 and bridge die 206.

The method of FIG. 4 also includes bonding 406 the encapsulated component group to a carrier wafer 212. The carrier wafer 212 is a wafer of material such as silicon that provides structural and mechanical support for the components after removal of the carrier 204, thereby exposing the redistribution layers 205 of the dies 202.

Figure 5:
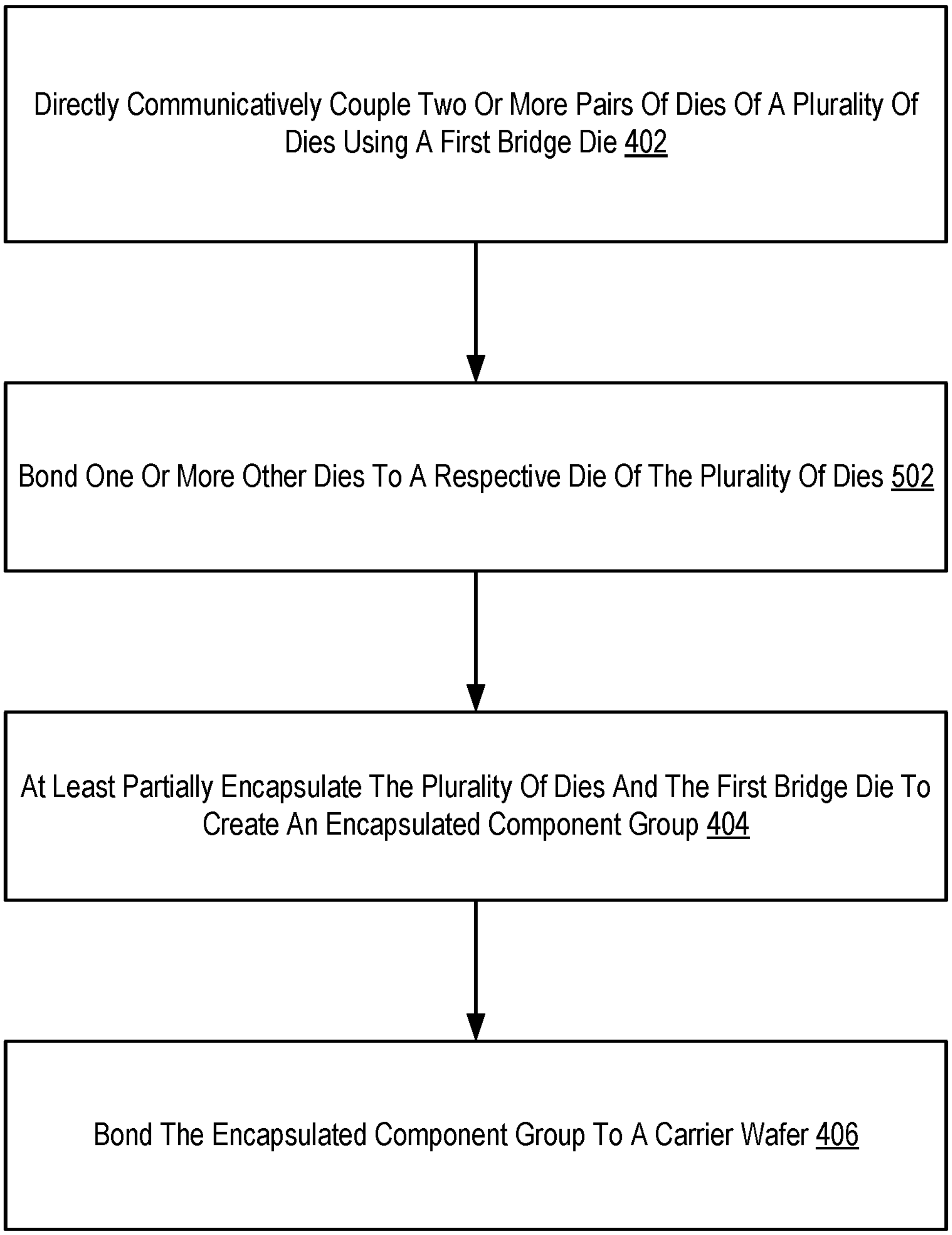
FIG. 5 is a flowchart of another example method of manufacture for multi-die communications couplings using a single bridge die according to some implementations.

For further explanation, FIG. 5 sets forth a flow chart illustrating an optional alternative implementation of the example method of manufacture set forth in FIG. 4. The method of FIG. 5 is described here with respect to elements depicted in the example FIGS. 2A-3I. The method of FIG. 5 differs from that of FIG. 4 in that the method of FIG. 5 includes bonding 502 one or more other dies 208 to a respective die 202 of the plurality of dies 202. The dies 208 are similar in functionality to the dies 202. In some implementations, a surface of a die 208 contacting a die 202 includes one or more redistribution layers (not shown) similar to redistribution layers 205. In implementations where the dies 208 are bonded to the dies 202, the dies 202 include one or more through silicon vias (TSVs) (not shown). The TSVs provide a conductive pathway from one surface of a die 202 to another surface of the die 202. Thus, the TSVs provide a conductive pathway from a die 208 to the redistribution layers 205 of a die 202, thereby providing operative access to the die 208 via the redistribution layers 205.

In some implementations, additional dies 208 are optionally bonded to an underlying die 208, thereby creating an additional layer of dies 208. Additionally, in implementations where only some of the dies 202 have dies 208 added, a silicon dummy wafer is added to those dies 202 without dies 208 to ensure a substantially coplanar height across the chip.

Figure 6:
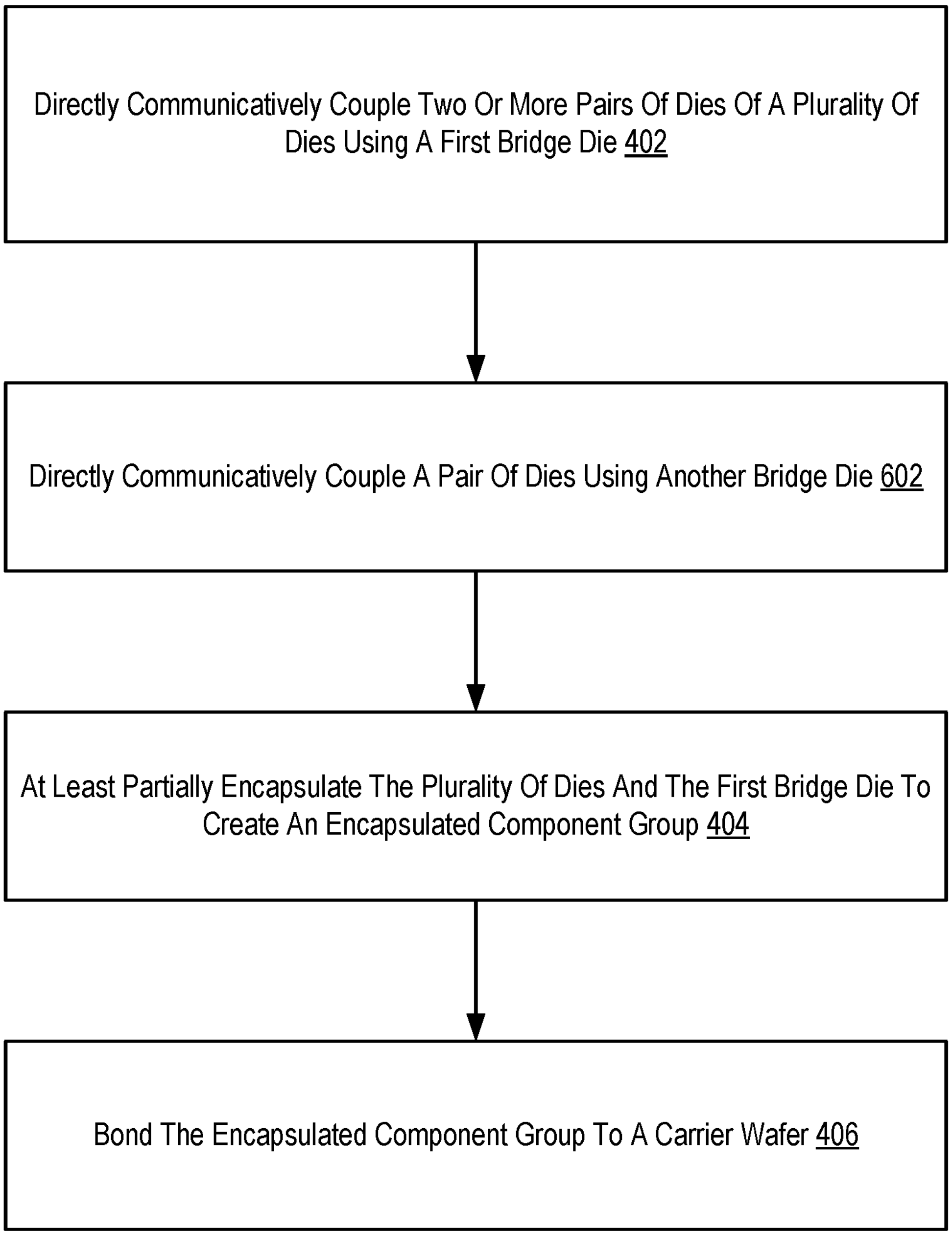
FIG. 6 is a flowchart of another example method of manufacture for multi-die communications couplings using a single bridge die according to some implementations.

For further explanation, FIG. 6 sets forth a flow chart illustrating another example implementation of the method FIG. 4. The method of FIG. 6 is described here with respect to elements depicted in FIGS. 2A-3I. The method of FIG. 6 differs from FIG. 4 in that the method of FIG. 6 includes directly communicatively coupling 602 a pair of dies 202 using a second bridge die 122. In some implementations, the pair of dies 202 coupled by the second bridge die 122 is not also coupled by the first bridge die 206. In other implementations, the pair of dies 202 coupled by the second bridge die 122 is not also coupled by the first bridge die 206. The second bridge die 122 provides a direct communications path with a single pair of dies 202. One skilled in the art will appreciate that, in some implementations, multiple second bridge dies 122 are used to couple various pairs of dies 202.

In view of the explanations set forth above, readers will recognize that the benefits of multi-die communications couplings using a single bridge die include improved performance of a computing system by reducing the spatial footprint and power consumption of a chip while maintaining direct cross-die communications paths.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. A chip for multi-die communications couplings using a single bridge die, comprising:

a plurality of dies each comprising one or more functional circuit blocks and a first side mounted to back-end-of-line (BEOL) structures and configured to be coupled to a substrate;

a first bridge die coupling two or more pairs of dies of the plurality of dies, wherein the first bridge die is mounted on a second opposite side of the plurality of dies, opposite from the BEOL structures, wherein the two or more pairs of dies comprise a first pair of non-adjacent dies and a second pair of non-adjacent dies, and wherein communication paths in the first bridge die coupling the first pair and the second pair are non-overlapping.

2. The chip of claim 1, further comprising one or more redistribution layers (RDLs) positioned between the first bridge die and the two or more pairs of dies, wherein the RDLs contact the second opposite side of the plurality of dies opposite from the BEOL structures.

3. The chip of claim 1, further comprising a first stacked die positioned entirely on one die of the two or more pairs of dies and next to the first bridge die.

4. The chip of claim 1, wherein a first pair of dies coupled by the first bridge die comprises a first die and a second die and a second pair of dies coupled by the first bridge die comprises the first die and a third die.

5. The chip of claim 1, wherein a plurality of communication paths in the first bridge die are non-overlapping.

6. The chip of claim 1, wherein a plurality of communication paths in the first bridge die are overlapping.

7. The chip of claim 1, further comprising one or more other dies each bonded to a respective die of the plurality of dies.

8. The chip of claim 7, wherein the plurality of dies comprises one or more through-silicon vias (TSVs) to the one or more other dies.

9. The chip of claim 1, wherein the plurality of dies comprises a plurality of system-on-chip dies.

10. A method for multi-die communications couplings using a single bridge die, the method comprising:

coupling, via a first bridge die, two or more pairs of dies in a plurality of dies, wherein each of the plurality of dies comprises one or more functional circuit blocks and a first side mounted to back-end-of-line (BEOL) structures and configured to be coupled to a substrate, and wherein the first bridge die is mounted on a second opposite side of the plurality of dies, opposite from the BEOL structures, wherein the two or more pairs of dies comprise a first pair of non-adjacent dies and a second pair of non-adjacent dies, and wherein communication paths in the first bridge die coupling the first pair and the second pair are non-overlapping;

at least partially encapsulating the plurality of dies and the first bridge die to create an encapsulated component group; and bonding the encapsulated component group to a carrier wafer.

11. The method of claim 10, further comprising bonding one or more other dies to a respective die of the plurality of dies, wherein the one or more other dies are included in the encapsulated component group.

12. The method of claim 10, further comprising coupling a pair of dies using a second bridge die.

13. The method of claim 10, wherein the first bridge die couples each die of the plurality of dies to each other die.

14. An apparatus for multi-die communications couplings using a single bridge die comprising:

computer memory; and a system-on-chip operatively coupled to the computer memory, wherein the system-on-chip comprises:

a plurality of dies each comprising one or more functional circuit blocks and a first side mounted to back-end-of-line (BEOL) structures and configured to be coupled to a substrate;

a first bridge die coupling two or more pairs of dies of the plurality of dies, wherein the first bridge die is mounted on a second opposite side of the plurality of dies, opposite from the BEOL structures, wherein the two or more pairs of dies comprise a first pair of non-adjacent dies and a second pair of non-adjacent dies, and wherein communication paths in the first bridge die coupling the first pair and the second pair are non-overlapping.

15. The apparatus of claim 14, wherein the system-on-chip further comprises one or more second bridge dies each coupling one or more other pairs of dies.

16. The apparatus of claim 14, wherein the first bridge die couples each die of the plurality of dies to each other die.

17. The apparatus of claim 14, wherein a plurality of communication paths in the first bridge die are non-overlapping.

18. The apparatus of claim 14, wherein a plurality of communication paths in the first bridge die are overlapping.

19. The apparatus of claim 14, wherein the system-on-chip further comprises one or more other dies each bonded to a respective die of the plurality of dies.

20. The apparatus of claim 19, wherein the plurality of dies comprises one or more through-silicon vias (TSVs) to the one or more other dies.

* * * * *